United States Patent
Wang et al.

(10) Patent No.: US 9,155,222 B2
(45) Date of Patent: Oct. 6, 2015

(54) ELECTRONIC DEVICE

(71) Applicant: ShenZhen Treasure City Technology Co., LTD., Shenzhen (CN)

(72) Inventors: Zhen-Yu Wang, Shenzhen (CN); Chang-Shen Chang, New Taipei (TW); Ben-Fan Xia, Shenzhen (CN)

(73) Assignee: ShenZhen Treasure City Technology Co., LTD., ShenZhen (CN)

( * ) Notice: Subject to any disclaimer, the term of this patent is extended or adjusted under 35 U.S.C. 154(b) by 168 days.

(21) Appl. No.: 13/960,838

(22) Filed: Aug. 7, 2013

(65) Prior Publication Data

US 2014/0049915 A1 Feb. 20, 2014

(30) Foreign Application Priority Data

Aug. 15, 2012 (CN) .......................... 2012 1 02897065

(51) Int. Cl.
*H05K 7/20* (2006.01)
*G06F 1/20* (2006.01)

(52) U.S. Cl.
CPC ............ *H05K 7/20127* (2013.01); *G06F 1/203* (2013.01); *H05K 7/20181* (2013.01)

(58) Field of Classification Search
CPC combination set(s) only.
See application file for complete search history.

(56) References Cited

U.S. PATENT DOCUMENTS

| | | | |
|---|---|---|---|
| 7,362,568 B2* | 4/2008 | Huang | 361/679.48 |
| 7,660,118 B2* | 2/2010 | Tatsukami et al. | 361/697 |
| 2002/0039886 A1* | 4/2002 | Doi | 455/25 |
| 2010/0067195 A1* | 3/2010 | Tanaka | 361/692 |
| 2010/0073875 A1* | 3/2010 | Suzuki et al. | 361/695 |
| 2010/0238619 A1* | 9/2010 | Shirasaka | 361/679.08 |
| 2012/0300093 A1* | 11/2012 | Laudrain et al. | 348/222.1 |

* cited by examiner

*Primary Examiner* — Gregory Thompson
(74) *Attorney, Agent, or Firm* — Novak Druce Connolly Bove + Quigg LLP

(57) ABSTRACT

An electronic device includes a first housing with a first air inlet and outlet, a heat dissipation assembly, and a filter structure between the first housing and the heat dissipation assembly. The heat dissipation assembly defines a second air inlet and outlet. The first air inlet, the second air inlet, the second air outlet and the first air outlet communicate with each other. The heat dissipation assembly draws air across itself from the two air inlets, and expels the air from the two air outlets. The filter structure covers the second air inlet and defines a plurality of very small holes which function to filter dust out from the incoming air.

11 Claims, 8 Drawing Sheets

ELECTRONIC DEVICE

BACKGROUND

1. Technical Field

The present disclosure relates to an electronic device, and particularly to an electronic device having a heat dissipation assembly.

2. Description of Related Art

A heat dissipation assembly is a major component of a laptop. The heat dissipation assembly takes heat from the heat generating components, such as CPU, for cooling the heat generating components. The heat dissipation assembly is fixed in a housing with an air inlet and an air outlet. Air enters into the housing through the air inlet, and then comes out from the air outlet, such that the heat generated by the heat generating component can be dissipated. However, dust can enter into the housing with the air from the atmosphere, and the heat dissipation assembly in the housing will be dirty because of the dust. The performance of the heat dissipation assembly will be affected as the dust accumulates.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
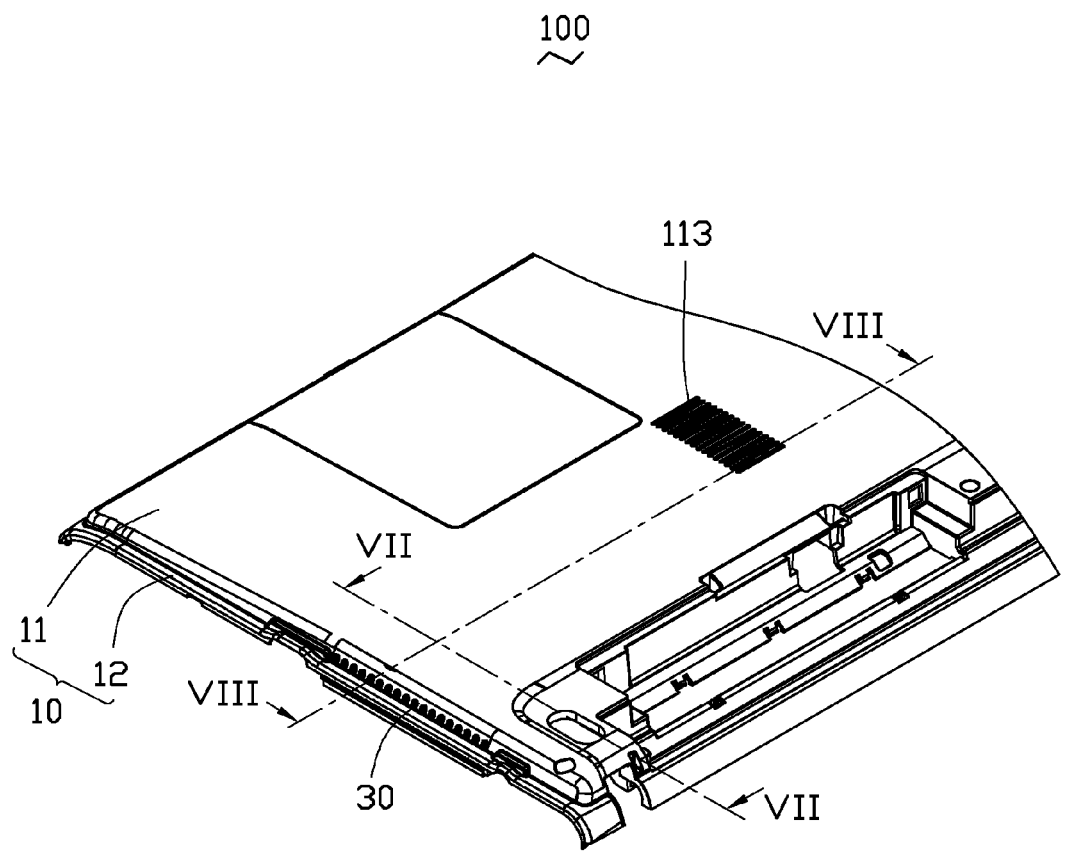
FIG. 1 is a partial isometric view of an electronic device.
Figure 2:
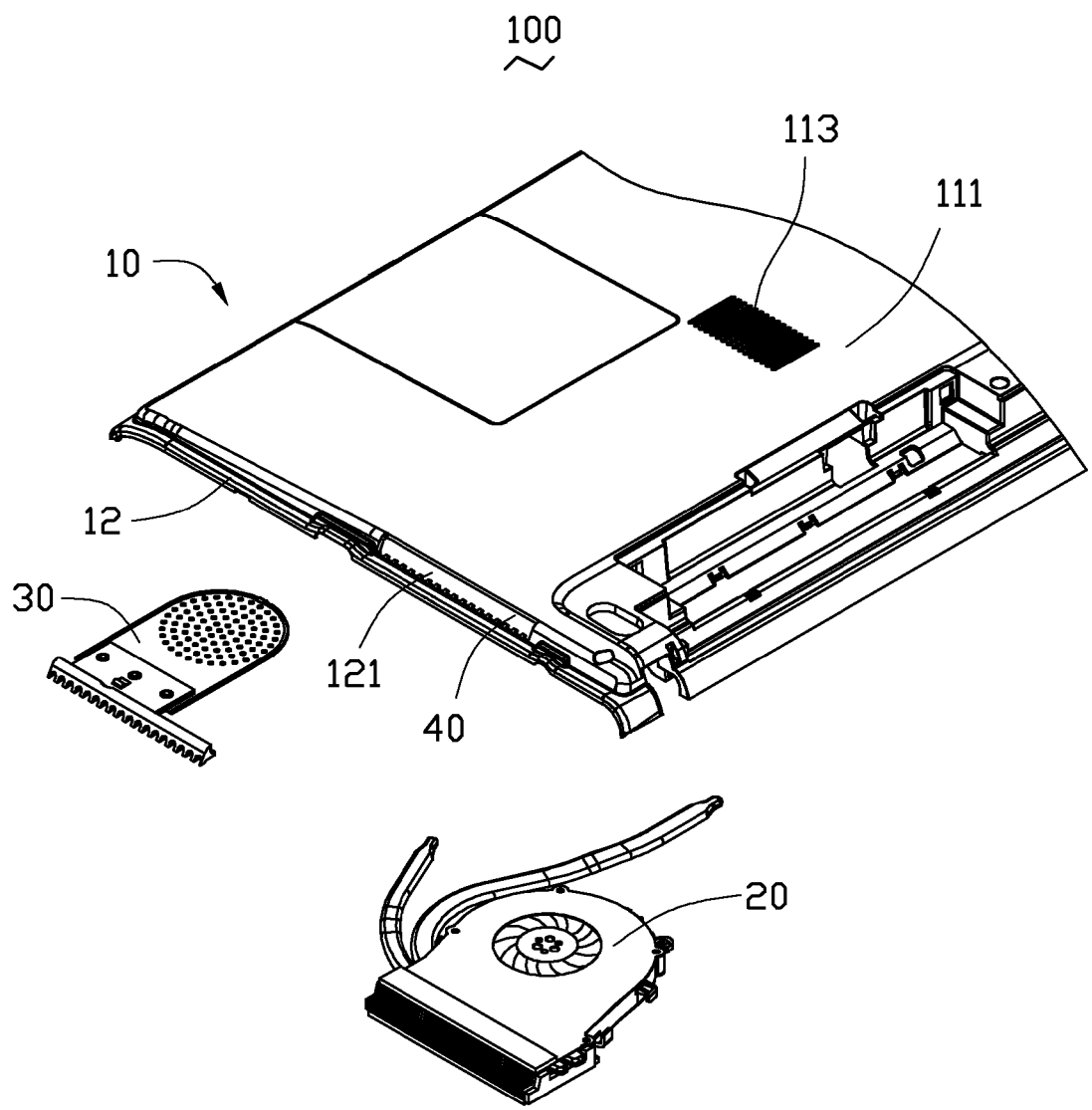
FIG. 2 is an exploded view of the electronic device in FIG. 1, the electronic device including a first housing, a heat dissipation assembly, and a filter structure inserted between the first housing and the heat dissipation assembly.
Figure 3:
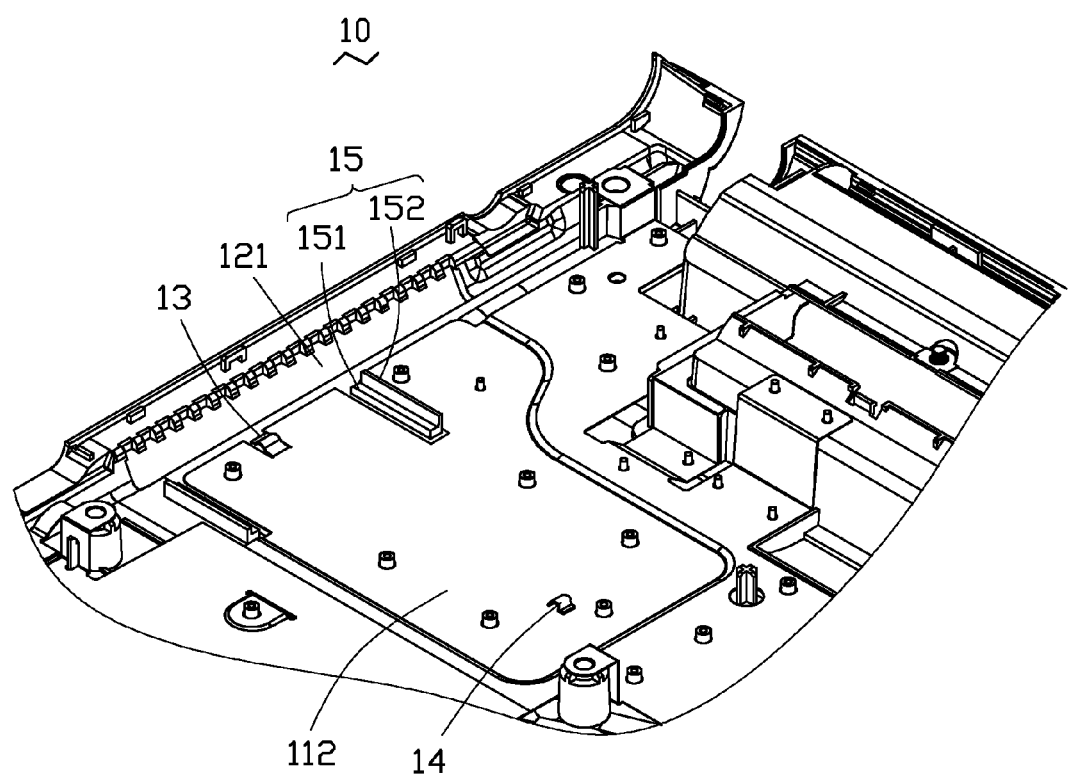
FIG. 3 is an isometric view of the first housing of FIG. 2 viewed from another aspect.

FIGS. 1-3 show an electronic device 100 of an embodiment. The electronic device 100 includes a first housing 10 allowing air to enter and exit the first housing 10, a heat dissipation assembly 20 fixed in the first housing 10, and a filter structure 30 detachably inserted between the first housing 10 and the heat dissipation assembly 20. The heat dissipation assembly 20 attaches to a surface of a heat-generating component, for instance, a CPU (not shown), and dissipates the heat generated by the heat-generating component. The filter structure 30 prevents dust from entering into the heat dissipation assembly 20 with the air. In the embodiment, the electronic device 100 is a laptop.

The first housing 10 includes a main plate 11, and a side wall 12 extending from the edge of the main plate 11. The main plate 11 includes an outer surface 111, an inner surface 112 opposite to the outer surface 111, and a first air inlet 113. The first air inlet 113 defines a number of through holes for allowing air to enter into the first housing 10. The side wall 12 defines a first air outlet 121 for allowing air to exit from the first housing 10.

A first resilience member 13, a second resilience member 14, and two rails 15 extend from the inner surface 112. The two rails 15 symmetrically extend from the inner surface 112 and are adjacent to the first air outlet 121. The two rails 15 are separated from each other. Each rail 15 includes a horizontal portion 151 and a vertical portion 152 perpendicularly extending from the horizontal portion 151. The first resilience member 13 and the second resilience member 15 are arched and extend from the inner surface 112. The first resilience member 13 and the second resilience member 14 are separated along lengths of the two rails 15. The first resilience member 13 is adjacent to the first air outlet 121. The second resilience member 14 is distanced from the first air outlet 121.

Figure 4:
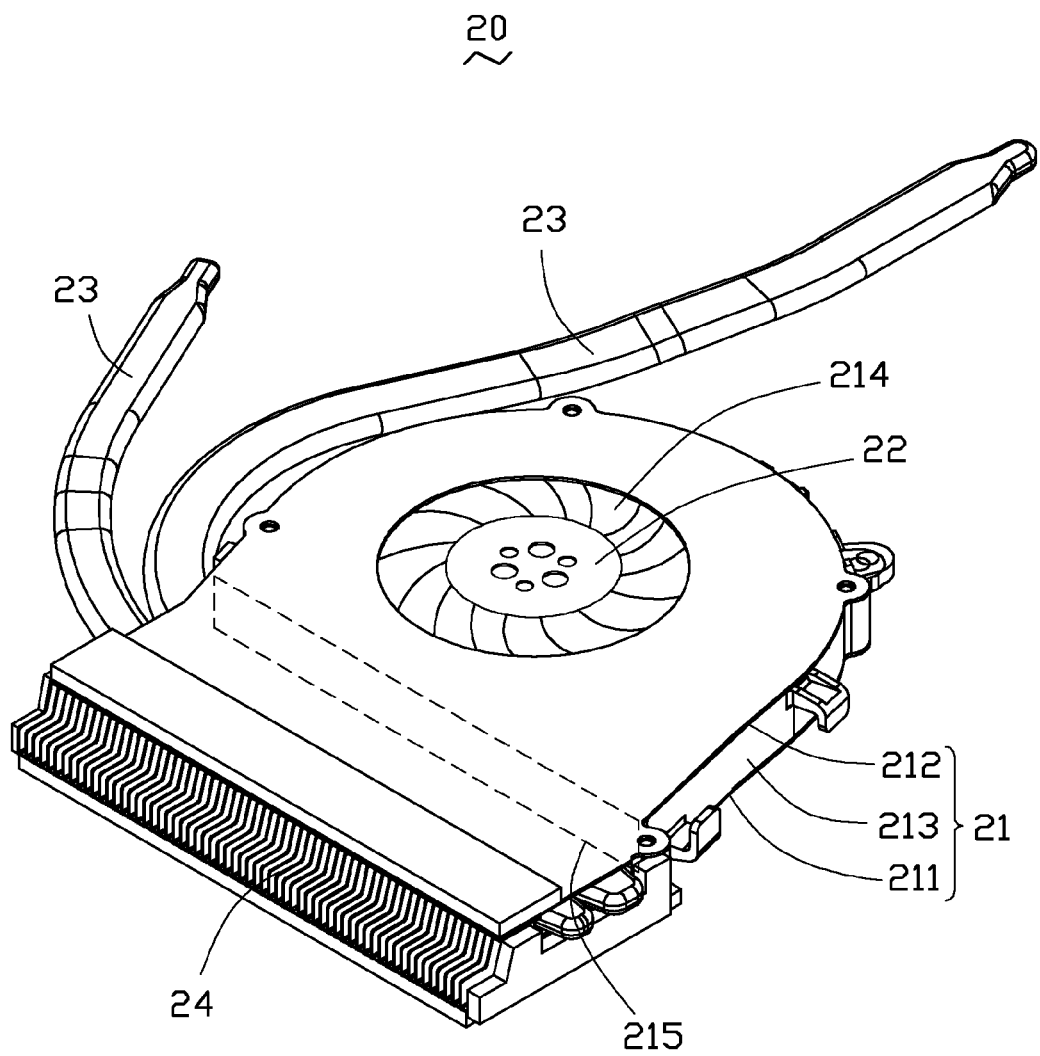
FIG. 4 is an isometric view of the heat dissipation assembly in FIG. 2.
Figure 7:
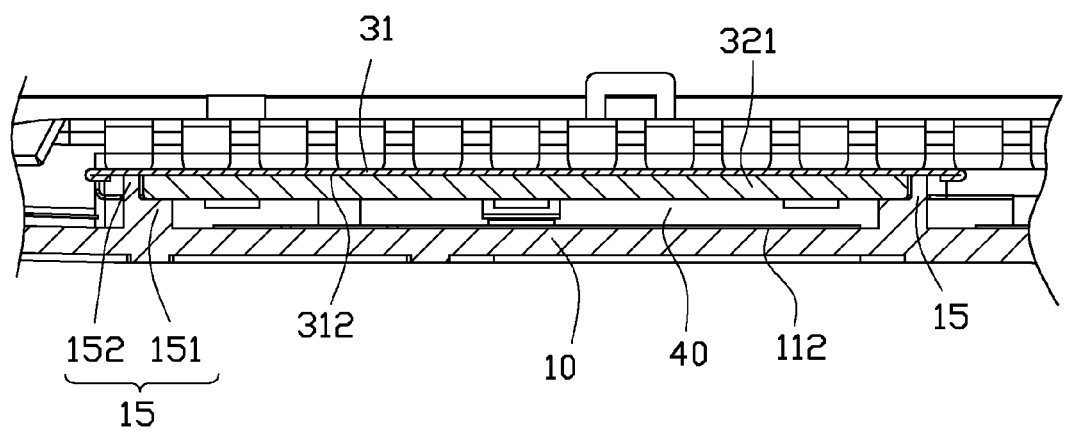
FIG. 7 is a cross-sectional view of the electronic device taken along line VII-VII in FIG. 1.

Referring to FIGS. 4 and 7, the heat dissipation assembly 20 is fixed on the inner surface 112 of the first housing 10 by screws. A gap 40 is formed between the first housing 10 and the heat dissipation assembly 20. The heat dissipation assembly 20 includes a second housing 21, a fan 22 fixed in the second housing 21, two heat pipes 23, and a number of heat fins 24 facing the fan 22. The second housing 21 includes an upper plate 211, a bottom plate 212 facing the upper plate 211, and a side wall 213 connected between the upper plate 211 and the bottom plate 212. The upper plate 211, the bottom plate 212 and the side wall 213 combine together to form a second air outlet 215. The bottom plate 212 defines a second air inlet 214 communicating with the second air outlet 215. An end of the heat pipe 23 is attached to heat generating components (not shown) of the electronic device 100, while the other end is inserted into the inside of the number of heat fins 24. The two heat pipes 23 absorb heat from the heat generating components and transfer the heat to the heat fins 24. The fan 22 runs to introduce the air into the second housing 21 through the second air inlet 214 and discharge the air through the second air outlet 215, thus the air flow through the heat fins 24 takes away the heat from the heat fins 24.

Figure 5:
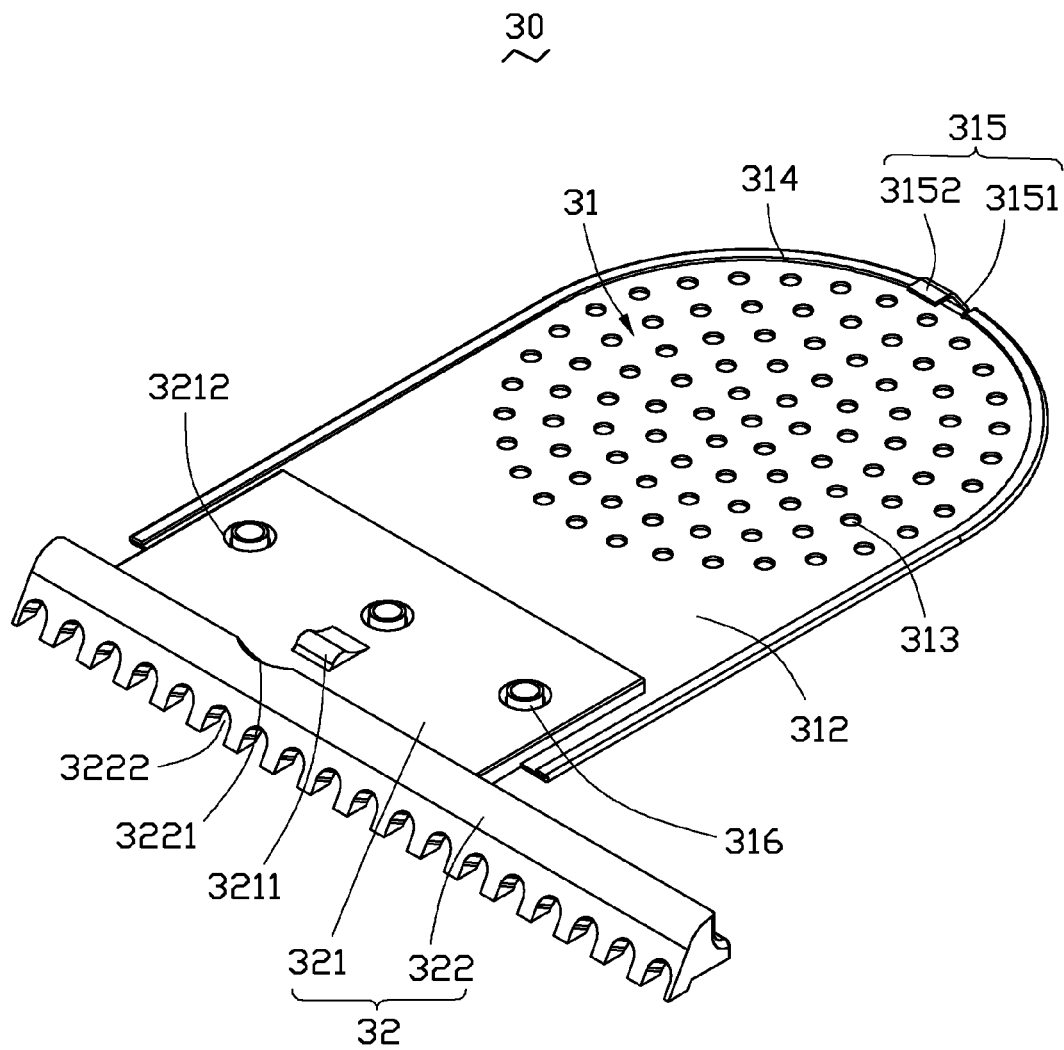
FIG. 5 is an isometric view of the filter structure in FIG. 2.
Figure 6:
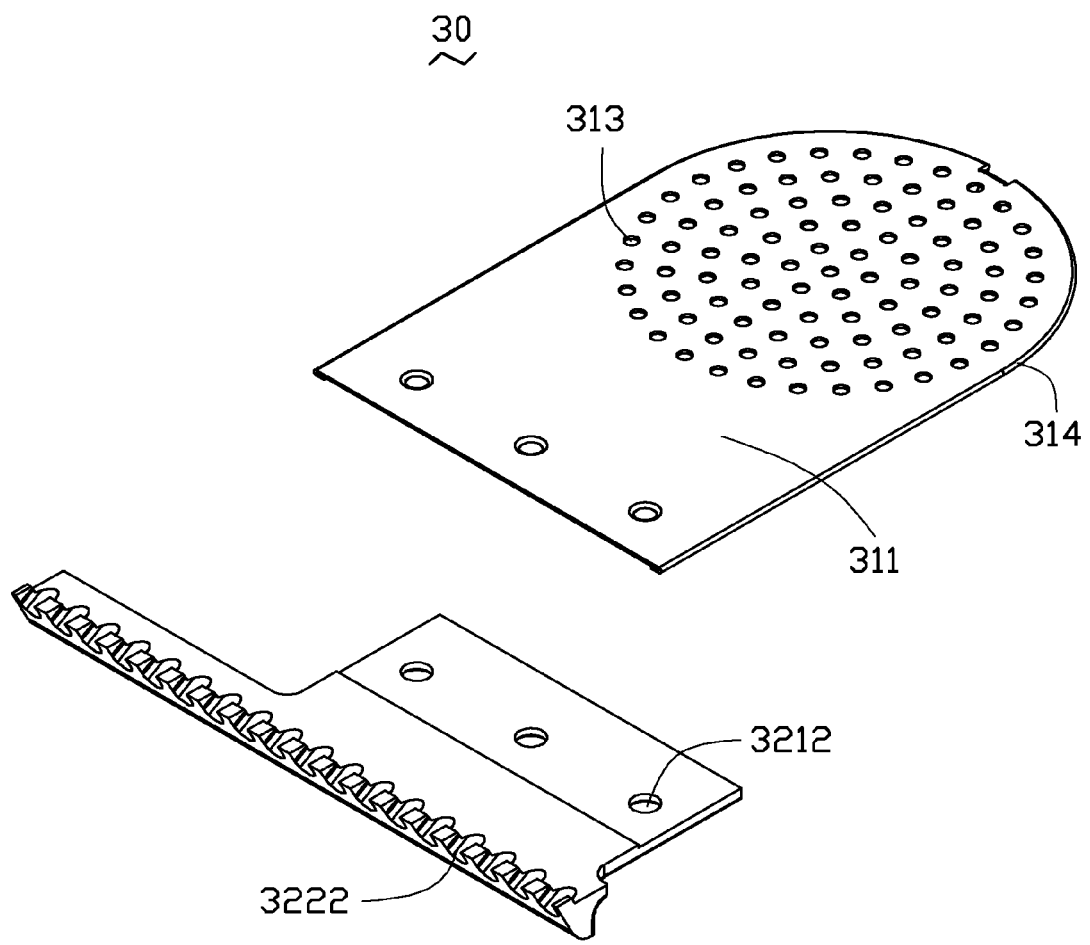
FIG. 6 is an exploded view of the filter structure of FIG. 5 viewed from another aspect.

Referring to FIGS. 5 and 6, the filter structure 30 is inserted into the gap 40 to be located between the first housing 10 and the heat dissipation assembly 20 through the first air outlet 121. The filter structure 30 includes a filter screen 31 and an operating member 32 fixed on the filter screen 31. The filter screen 31 and the operating member 32 are made of plastic material, or metal, or ceramic.

The filter screen 31 includes an upper surface 311, a bottom surface 312 opposite to the upper surface 311, a number of circular vent holes 313, a flange 314 extending from the edge of the filter screen 31, a supporting piece 315 formed on the flange 314, and several fixing columns 316 located on the bottom surface 312. The vent holes 313 correspond to the second air inlet 214. All of the vent holes 313 are through holes which are arranged on the respective peripheries of a number of concentric circles. The vent holes are dimensioned and arranged to filter out dust from the air to prevent the dust from entering the heat dissipation assembly 20. The flange 314 prevents the filter screen 31 from being deformed. The supporting piece 315 corresponds to the second resilience member 14. The supporting piece 315 includes a first portion 3151 extending obliquely from the flange 314, and a second portion 3152 extending from the end of the first portion 3151 and facing the bottom surface 312. The several fixing columns 316 fasten the operating member 32 on the filter screen 31. In the embodiment, the thickness of the filter screen 31 is from 0.2 mm to 0.4 mm. The diameters of all of the vent holes 313 are equal to or less than 1 mm. In other embodiments, the vent holes 313 may be, but are not limited to, shapes such as triangular or square.

The operating member 32 includes a fixing portion 321 and an operating portion 322 integrated with the fixing portion 321. The fixing portion 321 includes a projection 3211 corresponding to the first resilience member 13, and several fixing holes 3212 corresponding to the several fixing columns 316. The fixing portion 321 is fixed on the bottom surface 312 of the filter screen 31. The operating portion 322 defines a concave portion 3221 and a number of grooves 3222. The concave portion 3221 is defined in the bottom side of the operating portion 322, thus it is easy for user to remove the filter structure 30 from the gap 40. The grooves 3222 are defined in the top side of the operating portion 322 facing the first air outlet 121. When the filter structure 30 is inserted into the gap 40, the grooves 3222 communicate with the first air outlet 121, to allow air to exit from the first housing 10.

Figure 8:
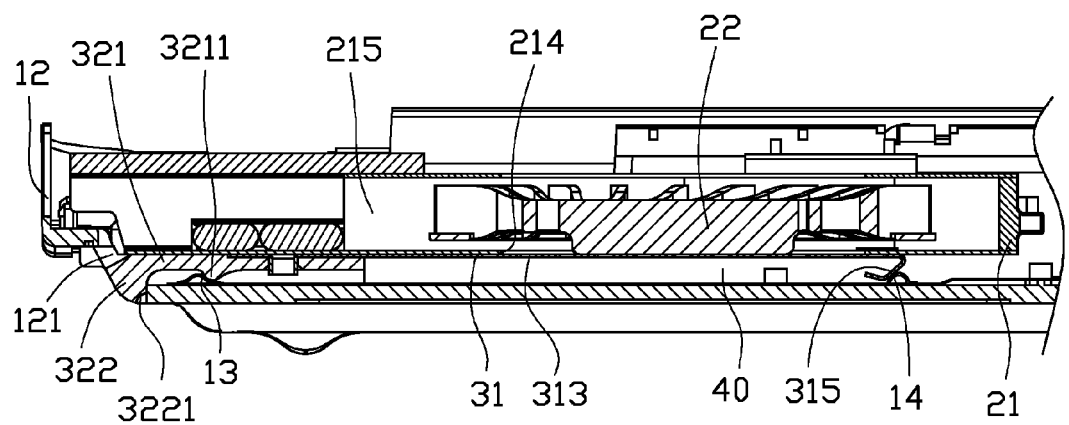
FIG. 8 is a cross-sectional view of the electronic device taken along line VIII-VIII in FIG. 1.

Referring to FIGS. 7 and 8, when the filter structure 30 is assembled to the first housing 10, firstly, the filter structure 30 is inserted into the gap 40 through the first air outlet 121, and the bottom surface 312 faces the inner surface 112. Next, the fixing portion 321 slides on the two rails 15 until the operating portion 322 is resisted by the side wall 12. At this point, the projection 3211 resists against the first resilience member 13, so as to prevent the filter structure 30 moving out from the gap 40, due to gravity or vibration in operation. The supporting piece 315 resists the second resilience member 14, so that the filter screen 31 is tightly held to cover the second air inlet 214 when the heat dissipation assembly 20 is attached, and the vent holes 313 communicate with the second air inlet 214 for the free flow of air.

When the filter structure 30 is removed from the first housing 10, the filter structure 30 is pulled out by applying a force to the operating portion 322, thus the filter structure 30 can be removed.

As described above, the diameters of the vent holes 313 are small enough to prevent household dust from entering into the second housing 21. Thus the performance of the heat dissipation assembly 20 will not be affected over time, or as quickly affected. Moreover, the filter screen 30 can be removed from the gap 40, for cleaning and clearing off any dust which has accumulated on the outside of the filter screen 31, without disassembling the electronic device 100.

Even though relevant information and the advantages of the present embodiments have been set forth in the foregoing description, together with details of the functions of the present embodiments, the disclosure is illustrative only; and changes may be made in detail, especially in the matters of shape, size, and arrangement of parts within the principles of the present embodiments to the full extent indicated by the broad general meaning of the terms in which the appended claims are expressed.

What is claimed is:

1. An electronic device comprising:
    a first housing defining a first air inlet and a first air outlet; and
    a heat dissipation assembly fixed in the first housing, the heat dissipation assembly defining a second air inlet and a second air outlet; the first air inlet, the second air inlet, the second air outlet and the first air outlet communicating with each other; the heat dissipation assembly configured for introducing the air into the heat dissipation assembly through the first and the second air inlets, and discharging the air through the first and the second air outlets; and
    a filter structure being received in the first housing between the first housing and the heat dissipation assembly, the filter structure defining a plurality of vent holes dimensioned and arranged to filter out dust from the air to prevent the dust from entering the heat dissipation assembly.

2. The electronic device of claim 1, wherein a gap is formed between the first housing and the heat dissipation assembly corresponding to the first air outlet, the filter structure is detachably inserted into the gap through the first air outlet.

3. The electronic device of claim 2, wherein the first housing comprises a first resilience member adjacent to the first air outlet, the filter structure comprises a projection corresponding to the first resilience member, the first resilience member resists on the projection so as to prevent the filter structure from moving out from the gap.

4. The electronic device of claim 2, wherein the first housing further comprises a second resilience member distanced from the first air outlet, the filter structure comprises a supporting piece corresponding to the second resilience, the supporting piece resists on the second resilience member to enable the filter structure to cover the second air inlet.

5. The electronic device of claim 2, wherein the first housing further comprises two rails, the filter structure is slidable on the two rails into the first housing.

6. The electronic device of claim 1, wherein all of the vent holes are circular, the diameters of all of the vent holes are equal to or less than 1 mm.

7. The electronic device of claim 1, wherein the filter structure comprises a filter screen, the vent holes are defined in the filter screen.

8. The electronic device of claim 7, wherein the filter screen comprises a flange extending from the edge of the filter screen, the flange prevents the filter screen from being deformed.

9. The electronic device of claim 1, wherein the filter structure further comprises an operating member, the operating member comprises a concave portion configured for facilitating a user to remove the filter structure from the first housing.

10. The electronic device of claim 9, wherein the operating member further comprises a plurality of grooves, the grooves communicate with the first air outlet for allowing air to exit from the first housing.

11. The electronic device of claim 1, wherein the heat dissipation assembly comprises a second housing, the second air inlet and the second air outlet are defined in the second housing, the filter structure tightly attached to the second housing to cover the second air inlet, and the vent holes communicate with the second air inlet.

* * * * *